(12) United States Patent
Hattori et al.

(10) Patent No.: US 7,163,448 B2
(45) Date of Patent: Jan. 16, 2007

(54) CHEMICAL/MECHANICAL POLISHING METHOD FOR STI

(75) Inventors: Masayuki Hattori, Tokyo (JP); Nobuo Kawahashi, Tokyo (JP)

(73) Assignee: JSR Corporation, Tokyo (JP)

( * ) Notice: Subject to any disclaimer, the term of this patent is extended or adjusted under 35 U.S.C. 154(b) by 198 days.

(21) Appl. No.: 10/833,089

(22) Filed: Apr. 28, 2004

(65) Prior Publication Data

US 2004/0235396 A1 Nov. 25, 2004

(30) Foreign Application Priority Data

May 21, 2003 (JP) ............................. 2003-144034

(51) Int. Cl.
*B24B 1/00* (2006.01)

(52) U.S. Cl. .......................... 451/57; 451/37
(58) Field of Classification Search .................. 451/57, 451/60, 41, 37; 438/690–693
See application file for complete search history.

(56) References Cited

U.S. PATENT DOCUMENTS

| 6,126,514 | A * | 10/2000 | Muroyama | 451/36 |
| 6,326,309 | B1 * | 12/2001 | Hatanaka et al. | 438/693 |
| 6,343,976 | B1 * | 2/2002 | Yoshida et al. | 451/41 |
| 6,579,153 | B1 * | 6/2003 | Uchikura et al. | 451/41 |
| 6,638,143 | B1 * | 10/2003 | Wang et al. | 451/41 |
| 6,964,600 | B1 * | 11/2005 | Belov et al. | 451/41 |
| 2001/0036738 | A1 | 11/2001 | Hatanaka et al. | |
| 2005/0287931 | A1 * | 12/2005 | Saegusa et al. | 451/41 |

FOREIGN PATENT DOCUMENTS

| EP | 1 116 762 A1 | 7/2001 |
| EP | 1 160 300 A2 | 12/2001 |

* cited by examiner

*Primary Examiner*—Hadi Shakeri
(74) *Attorney, Agent, or Firm*—Oblon, Spivak, McClelland, Maier & Neustadt, P.C.

(57) ABSTRACT

A chemical/mechanical polishing method for polishing an object to be polished with an irregular surface, having a substrate with convexities and concavities, a stopper layer formed on the convexities of the substrate, and an embedded insulating layer formed to cover the concavities of the substrate and the stopper layer, wherein the method is characterized comprising a first polishing step of flattening the embedded insulating layer using a slurry (A) which can maintain the polishing speed at 500 Å/min or less and a second polishing step of further polishing the embedded insulating layer to cause the stopper layer on the convexities to be exposed using a slurry (B) which can maintain the polishing speed at 600 Å/min or more. The method is useful for flattening wafers during shallow trench isolation (STI) in manufacturing semiconductor devices.

8 Claims, 6 Drawing Sheets

CHEMICAL/MECHANICAL POLISHING METHOD FOR STI

BACKGROUND OF THE INVENTION

1. Field of the Invention

The present invention relates to a chemical/mechanical polishing method for STI and, more particularly, to a chemical/mechanical polishing method for STI which can be used for flattening wafers during shallow trench isolation in manufacturing semiconductor devices.

2. Description of Background Art

The storage capacity of memory devices has remarkably increased with the increase in the degree of integration, multilayer wiring, and the like of semiconductor devices. This is supported by the progress in microfabrication technologies. However, there are problems such as an increased chip size in spite of using multilayer wiring and the like and an increased cost for production of chips because of an increased number of production steps due to the progress in microfabrication technologies. In this situation, a chemical/mechanical polishing technology has been introduced into polishing of processed films and the like and has attracted attention. Many microfabrication technologies such as flattening have been put into practice by applying the chemical/mechanical polishing technology.

A shallow trench isolation (STI) technology is known as such a microfabrication technology, for example. In the STI technology, flatness of processed films such as an insulating film is important. An optimal abrasive flexibly responding to convexities and concavities of processed films is indispensable.

To respond to the progress of the STI technology at a high degree, an object of the present invention is to provide a chemical/mechanical polishing method for STI which can form a highly flat polished surface with minimal dishing and scratches on an object to be polished even if the object has convexities and concavities on the surface.

SUMMARY OF THE INVENTION

Specifically, in a method for polishing an object to be polished with an irregular surface, having a substrate with convexities and concavities, a stopper layer formed on the convexities of the substrate, and an embedded insulating layer formed to cover the concavities of the substrate and the stopper layer, the chemical/mechanical polishing method for STI of the present invention comprises a first polishing step of flattening the embedded insulating layer using a slurry (A) which can maintain the polishing speed at 500 Å/min or less and a second polishing step of further polishing the embedded insulating layer to cause the stopper layer on the convexities to be exposed using a slurry (B) which can maintain the polishing speed at 600 Å/min or more.

DETAILED DESCRIPTION OF THE INVENTION AND PREFERRED EMBODIMENTS

Figure 1:
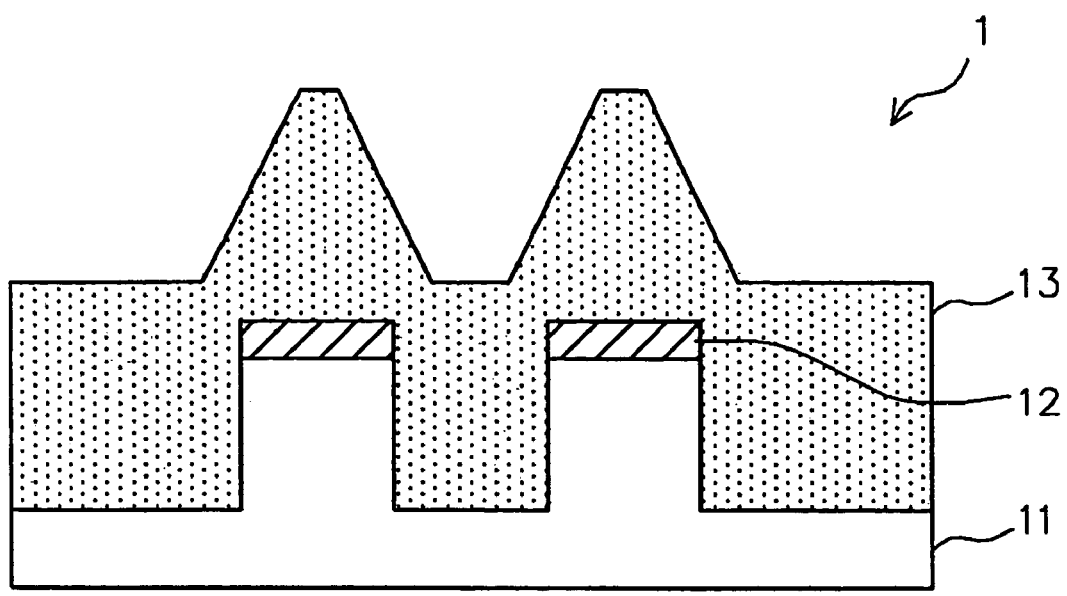
FIG. 1 is a cross-sectional view illustrating an embodiment of the object to be polished in the present invention.

The present invention will now be described in detail.

There are no specific limitations to the slurry (A) and slurry (B) used in the present invention insofar as the slurries contain abrasive grains. As the abrasive grains, inorganic particles, organic particles, organic-inorganic complex particles, and the like known in the art can be used without specific limitations.

As specific examples of inorganic materials forming the inorganic particles, silica, ceria, alumina, titanium oxide, chromium oxide, manganese dioxide, manganese sesquioxide, iron oxide, zirconiumoxide, silicon carbide, boron carbide, diamond, and barium carbonate can be given. The inorganic particles formed by these materials may be used either individually or in combination of two or more.

As examples of the silica, fumed silica synthesized by a fuming method in which silicon chloride, aluminum chloride, titanium chloride, or the like is reacted with oxygen and hydrogen in a gaseous phase, silica synthesized by a sol-gel method in which silica is produced from metal alkoxide by hydrolysis condensation, and colloidal silica synthesized by an inorganic colloidal method in which silica is purified by removing impurities can be given.

As specific examples of organic materials forming the organic particles, thermoplastic resins such as polyvinyl chloride, polystyrene, styrene-containing copolymers, polyacetal, saturated polyesters, polyamide, polycarbonate, polyolefins such as polyethylene, polypropylene, poly-1-butene, and poly-4-methyl-1-pentene, olefin-containing copolymers, phenoxy resins, and (meth)acrylic resins such as polymethyl methacrylate; copolymer resins having a crosslinking structure obtained by copolymerizing styrene, methyl methacrylate, or the like with divinylbenzene, ethylene glycol dimethacrylate, or the like; and heat-curable resins such as phenol resins, urea resins, melamine resins, epoxy resins, alkyd resins, and unsaturated polyester resins can be given.

The organic particles formed from these materials may be prepared by various methods such as an emulsion polymerization method, suspension polymerization method, emulsion dispersion method, and grinding method. The organic particles formed from these materials may be used either individually or in combination of two or more.

As the organic-inorganic complex particles, any particles formed from the inorganic particles and organic particles can be used without any specific limitations to the type and configuration insofar as the inorganic particles and organic particles are integrated so that the particles are not easily separated during polishing. Particles having polysiloxane and the like bonded to at least the surface of polymer particles which are prepared by, for example, polycondensing alkoxysilane, aluminum alkoxide, titanium alkoxide, or the like in the presence of polymer particles such as polystyrene particles or poly(methyl methacrylate) particles can be used. The resulting polycondensates may be either directly bonded to functional groups of the polymer particles or bonded via a silane coupling agent or the like.

Organic-inorganic complex particles prepared by causing inorganic fine particles of silica, ceria, alumina, or the like to adhere to the surface of the organic particles such as polymer particles may also be used. Such inorganic fine particles may be either electrostatically retained on the organic particles or chemically bonded to the organic particles via functional groups such as hydroxyl groups in the inorganic fine particles via a silane coupling agent or the like.

Particles formed from organic particles and inorganic particles having zeta potentials with opposite charges bonded by an electrostatic force may also be used as the organic-inorganic complex particles.

The zeta potential of many organic particles is negative over the whole pH region or most of the region excluding the low pH region. Organic particles with a negative zeta potential can be obtained more certainly by producing the organic particles from polymers possessing carboxyl groups, sulfonic acid groups, or the like. In addition, it is possible to obtain organic particles having a positive zeta potential in a specific pH region by producing the organic particles having amino groups or the like.

On the other hand, the zeta potential of inorganic particles is highly dependent on the pH and becomes zero at a certain pH (an isoelectric point). The charge for the zeta potential is reversed around the isoelectric point.

Therefore, if specific organic particles and inorganic particles are mixed in a pH region in which the charge for the zeta potential is reversed, these organic particles and inorganic particles can be combined together into an integral complex by an electrostatic force. Even if the organic particles and inorganic particles have the same (positive or negative) zeta potential when mixed, these particles can be integrated by changing the pH to reverse either of the zeta potentials.

Furthermore, particles having polysiloxane or the like bonded to the surface of such inorganic-organic complex particles prepared by integrating the inorganic particles and organic particles by an electrostatic force can also be used, in which case such particles can be obtained by polycondensing alkoxysilane, aluminum alkoxide, titanium alkoxide, or the like in the presence of the complex particles integrated by an electrostatic force.

The inorganic particles, organic particles, and organic-inorganic complex particles may be used either individually or in combination of two or more as the abrasive grains.

The abrasive grains contained in the above-mentioned slurry (A) or slurry (B) are preferably at least one type of inorganic particles selected from ceria and silica.

The abrasive grains contained in the above-mentioned slurry (A) or slurry (B) have an average particle diameter of preferably 5–1,000 nm, more preferably 5–700 nm, are still more preferably 10–500 nm. If the average particle diameter is less than 5 nm, the polishing speed may not be sufficient. If the average particle diameter is more than 1,000 nm, not only may it be difficult to adequately control dishing and erosion, but also the abrasive grains may be separated by precipitation, thereby impairing stability of the slurry. The abrasive grains having an average particle diameter in the above range can exhibit a high polishing speed, adequately control dishing and erosion, and produce a stable slurry without precipitation and separation of particles.

The average particle diameter of the above-mentioned abrasive grains can be measured using a laser dispersion diffraction-type measuring instrument or a transmission electron microscope.

It is desirable that the abrasive grains contain neither metals such as iron, nickel, zinc, and sodium, nor ions of these metals and the content of these metal impurities is preferably less than 10 ppm. More preferably, the content of these metal impurities is 5 ppm or less, with a still more preferable content being 3 ppm or less, and a particularly preferable content being 1 ppm or less. The abrasive grains with such a reduced impurity content do not leave residues on the polished surface after the polishing process and have reduced possibility of suffering from a decrease in the yield.

The amount of the abrasive grains in the slurry (A) or slurry (B) is preferably 0.02–20 wt %, more preferably 0.05–10 wt %, and still more preferably 0.1–5 wt %.

When the abrasive grains are ceria, the content of the ceria in the slurry (A) or slurry (B) is preferably 0.02–5 wt %, more preferably 0.05–4 wt %, and still more preferably 0.1–3 wt %. When the abrasive grains are silica, the content of the silica in the slurry (A) or slurry (B) is preferably 0.5–20 wt %, more preferably 1–15 wt %, and still more preferably 2–12 wt %. Stability of the slurries may be impaired if the abrasive grain content is out of the above range. The type and content of the abrasive grains in the slurry (A) may be either the same as or different from those in the slurry (B).

The slurry (A) and slurry (B) have different polishing speeds. To adjust the polishing speeds, increase dispersion stability, and improve polishing performance by adjusting the difference in the polishing speeds when two or more types of objects such as films with different hardness are polished, for example, additives such as a water-soluble polymer, surfactant, acid, base, oxidizer, and polyvalent metal ions can be added to the slurry (A) or (B).

Examples of the water-soluble polymer include, but are not limited to: (1) polycarboxylic acids such as poly(meth)acrylic acid, poly(meth)acrylic acid-containing copolymers, and ammonium salts, alkyl ammonium salts (wherein the alkyl group preferably has 1 or 2 carbon atoms), or potassium salts of these polymers or copolymers; (2) polystyrenesulfonic acid, polyisoprenesulfonic acid, and their ammonium salts or potassium salts; (3) copolymers of a vinyl-containing monomer such as acrylic acid, methacrylic acid, styrenesulfonic acid (or its salt), naphthalenesulfonic acid (or its salt), or isoprenesulfonic acid (or its salt) and a (meth)acrylamide-containing hydrophilic monomer; (4) copolymers of a vinyl-containing monomer such as acrylic acid, methacrylic acid, styrenesulfonic acid (or its salt), naphthalenesulfonic acid (or its salt), or isoprenesulfonic acid (or its salt), a (meth)acrylic ester, and a hydrophobic monomer; (5) polyglutamic acid obtained by condensation polymerization of glutamic acid; and (6) nitrogen-containing polymers such as polyvinylpyrrolidone, polyacrylamide, and polyethyleneimine. These polymers can be used either individually or in combination of two or more.

When the above-described water-soluble polymer is used, the polyethylene glycol-reduced weight average molecular weight determined by gel permeation chromatography (solvent: water, hereinafter referred to as "aqueous GPC") of the water-soluble polymer is preferably 1,000–100,000, and more preferably 2,000–50,000.

When the water-soluble polymer is added to the slurry (A) or slurry (B), the amount is preferably 0.001–10 wt %, more preferably 0.005–5 wt %, and most preferably 0.01–3 wt % of the total amount of each slurry. The types and contents of the water-soluble polymers used in the slurry (A) and slurry (B) may be either the same or different, but the contents usually differ to obtain different polishing speeds.

As the above-mentioned surfactant, any one of cationic, anionic, and nonionic surfactants can be used. Among these, as the cationic surfactant, an aliphatic amine salt, aliphatic ammonium salt, and the like can be given. As examples of the anionic surfactant, fatty acid soap; carboxylates such as alkyl ether carboxylate; sulfonates such as alkylbenzenesulfonates including dodecylbenzenesulfonate, alkylnaphthalenesulfonate, and α-olefin sulfonate; sulfates such as higher alcohol sulfates including lauryl alcohol sulfate, alkyl ether sulfate, and polyoxyethylene alkyl phenyl ether sulfate; and phosphates such as alkyl phosphate can be given. As examples of the nonionic surfactant, ether-type surfactants such as polyoxyethylene alkyl ether, ether ester-type surfactants such as a polyoxyethylene ether of glycerol ester, and ester-type surfactants such as a glycerol ester and sorbitan ester can be given. These surfactants can be used either individually or in combination of two or more.

When the surfactant is added to the slurry (A) or slurry (B), the amount is preferably 0.001–2 wt %, more preferably 0.005–1 wt %, and still more preferably 0.02–0.5 wt % of the total amount of each slurry. The types and contents of the surfactants used in the slurry (A) and slurry (B) may be either the same or different, but the contents usually differ to obtain different polishing speeds.

As the water-soluble polymer or surfactant to be used in the slurry (A) or slurry (B) of the present invention, organic acid salts such as the potassium salt or ammonium salt of poly(meth)acrylic acid, (meth)acrylic acid-containing copolymer, polystyrenesulfonic acid, or polyisoprenesulfonic acid are preferable. Particularly preferable water-soluble polymers or surfactants are the potassium or ammonium salt of polyacrylic acid and the potassium or ammonium salt of dodecylbenzenesulfonic acid.

The slurry (A) and slurry (B) may contain either the same type or different types of the above organic acid salts.

In the present invention, the types and contents of the organic acid salts used in the slurry (A) and slurry (B) are important factors to control the polishing speeds achieved by these slurries respectively to 500 Å/min or less and 600 Å/min or more. For example, when the same organic acid salt is used for both the slurry (A) and the slurry (B), the content of the salt should preferably be larger in the slurry (A) than in the slurry (B).

Specifically, when the organic acid salt used for both the slurry (A) and the slurry (B) is the potassium salt of polyacrylic acid, the content of the organic acid salt in the slurry (A) is preferably 1.0 wt % or more, and more preferably 1.0–3.0 wt %, and the content of the organic acid salt in the slurry (B) is preferably less than 1.0 wt %, and more preferably 0.01–0.9 wt %.

When the organic acid salt used for both the slurry (A) and the slurry (B) is the ammonium salt of polyacrylic acid, the content of the organic acid salt in the slurry (A) is preferably 1.3 wt % or more, and more preferably 1.3–3.0 wt %, and the content of the organic acid salt in the slurry (B) is preferably less than 1.3 wt %, and more preferably 0.01–1.25 wt %.

When the organic acid salt used for both the slurry (A) and the slurry (B) is the ammonium salt of dodecylbenzenesulfonic acid, the content of the organic acid salt in the slurry (A) is preferably 0.03 wt % or more, and more preferably 0.03–0.3 wt %, and the content of the organic acid salt in the slurry (B) is preferably less than 0.03 wt %, and more preferably 0.001 wt % or more but less than 0.03 wt %.

In the present invention, when different types of organic acid salt are used in the slurry (A) and slurry (B), the preferable amounts to be added are determined so that the polishing speeds achieved by these slurries, determined according to a later-described method, may be respectively 500 Å/min or less and 600 Å/min or more.

Either an organic acid or an inorganic acid can be used without specific limitations as the acid which is an additive. The slurry can be stabilized and selectivity can be improved by incorporating the acid.

As examples of the organic acid, p-toluenesulfonic acid, dodecylbenzenesulfonic acid, isoprenesulfonic acid, gluconic acid, lactic acid, citric acid, tartaric acid, malic acid, glycolic acid, malonic acid, formic acid, oxalic acid, succinic acid, fumaric acid, maleic acid, and phthalic acid can be given.

As examples of the inorganic acid, nitric acid, sulfuric acid, and phosphoric acid can be given.

These organic acids and inorganic acids may be respectively used either individually or in combination of two or more. A combination of the organic acid and the inorganic acid is also possible.

When the acid is added to the slurry (A) or slurry (B) the amount is preferably 2 wt % or less, and more preferably 1 wt % or less. If the content of the acid is in this range, the abrasive-grains exhibit excellent dispersibility and a sufficiently stable slurry can be produced.

In addition, a base may be added to the slurry (A) or slurry (B) to adjust the pH of the slurry according to the composition, whereby dispersibility of the abrasive grains, polishing speed, and selectivity can be improved. As the base, either an organic base or an inorganic base can be used without specific limitations.

As examples of the organic base, nitrogen-containing organic compounds such as ethylenediamine, ethanolamine, and tetramethylammonium hydroxide can be given.

As examples of the inorganic base, ammonia, potassium hydroxide, sodium hydroxide, rubidium hydroxide, and cesium hydroxide can be given. These organic bases and inorganic bases may be respectively used either individually or in combination of two or more. A combination of the organic base and the inorganic base is also possible.

When the base is added to the slurry (A) or slurry (B), the amount is preferably 1 wt % or less.

The pH of the slurries can be appropriately selected in a range in which the abrasive grains are stable, taking into consideration factors such as electrochemical characteristics of the object to be polished, dispersibility and stability of the abrasive grains, and polishing speed. When silica is used as the abrasive grains, the preferable pH range is 9–12, and the more preferable range is 10–11. When ceria is used, the preferable pH range is 3–12, and the more preferable range is 5–10. The pH of the slurries in these ranges can improve flatness of the polished surface.

As examples of the oxidizer, hydrogen peroxide, persulfate, and heteropolyacid can be given. Although these oxidizers can be added, it is more desirable not to add the oxidizers to the slurry (A) or slurry (B). As examples of the polyvalent metal ions, aluminum ions, titanium ions, and cerium ions can be given. Although these polyvalent metal ions can be added, it is more desirable not to add the polyvalent metal ions to the slurry (A) or slurry (B).

As the medium for the slurries, water, a mixture of water and an alcohol (e.g. ethanol), and a mixture of water and other components can be given. Of these, using water alone is particularly preferable.

In the present invention, the polishing speed of the slurry (A) or (B) can be determined as follows. The polishing speed is measured by polishing a uniform PETEOS (Plasma Enhanced-TEOS) film without a pattern (described below)

using a polishing apparatus ("EPO 112" manufactured by Ebara Corp.) equipped with a polishing pad ("IC1000(P)" manufactured by Rodel Inc.) under the following conditions.

(Polishing conditions)
Carrier load: 500 g/cm$^2$
Carrier rotation: 107 rpm
Polishing table rotation: 100 rpm
Slurry feed amount: 200 ml/min
Polishing time: 1 minute Each of the slurries (A) and (B) prepared in the above-described manner are used in the first and second polishing steps of the polishing method of the present invention.

The chemical/mechanical polishing method for STI of the present invention can be preferably used for polishing an object with an irregular surface, which comprises a substrate having convexities and concavities, a stopper layer formed on the convexities of the substrate, and an embedded insulating layer formed to cover the concavities of the substrate and the stopper layer.

There are no specific limitations to the configuration and size of the substrate, the configuration and size of the above convexities and concavities, the depth of the concavities, and the like. Silicon or the like can be given as the material forming the substrate.

There are no specific limitations to the thickness and the like of the above-mentioned stopper layer. Either the whole or a part of the above stopper layer may be formed on the convexities of the substrate. There are also no specific limitations to the thickness and the like of the above-mentioned embedded insulating layer.

As the material forming the above-mentioned stopper layer or embedded insulating layer, silicon nitride, silicon oxide (SiO$_2$), a boron phosphorous silicate glass (BPSG) film produced by adding a small amount of boron and phosphorus to silicon oxide, an insulating film called FSG (fluorine doped silicate glass) formed by doping silicon oxide with fluorine, a silicon oxide-containing insulating film with a low dielectric constant, and the like can be given.

As types of silicon oxide, a thermally oxidized film, PETEOS film, HDP film (High Density Plasma Enhanced-TEOS film), silicon oxide film obtained by a thermal CVD method, and the like can be given.

The thermally oxidized film can be formed by exposing silicon heated to a high temperature to an oxidizing atmosphere to cause the silicon to chemically react with oxygen or water.

The PETEOS film can be formed by a chemical vapor phase growth method from tetraethyl orthosilicate (TEOS) as a raw material under accelerating conditions using plasma.

The HDP film can be formed by a chemical vapor phase growth method from tetraethyl orthosilicate (TEOS) as a raw material under accelerating conditions using high density plasma.

The silicon oxide film obtained by a thermal CVD method can be prepared either by an atmospheric CVD method (AP-CVD method) or by a low pressure CVD method (LP-CVD method).

The boron phosphorous silicate glass (BPSG) film can be prepared either by an atmospheric CVD method (AP-CVD method) or by a low pressure CVD method (LP-CVD method).

The insulating film called FSG can be formed by a chemical vapor phase growth method under accelerating conditions using high density plasma.

The silicon oxide-containing insulating film with a low dielectric constant can be prepared by applying a raw material to a substrate by a roll coating method or the like, followed by heating in an oxidizing atmosphere. As such an insulating film, an HSQ (hydrogen silsesquioxane) film produced from triethoxysilane as a raw material, an MSQ (methyl silsesquioxane) film containing, in addition to tetraethoxysilane, methyl trimethoxysilane as a part of the raw materials, and the like can be given.

Moreover, insulating films with a low dielectric constant prepared from an organic polymer such as a polyarylene polymer, polyarylene ether polymer, polyimide polymer, or benzocyclobutene polymer as a raw material can be given.

The material forming the stopper layer usually differs from, but may be the same as, the material forming the embedded insulating layer.

As an example of the object to be polished, an object to be polished 1 (hereinafter referred to as "object 1") having a cross-sectional structure as shown in FIG. 1 can be given. The object 1 comprises a substrate 11 formed from silicon or the like and having convexities and concavities, a stopper layer 12 formed on the convexities of the substrate 11 from silicon nitride or the like, and an embedded insulating layer 13 formed to cover the concavities of the substrate 11 and the stopper layer 12. The object to be polished of the present invention has convexities and concavities on the surface. In the case of the object 1 shown in FIG. 1, the convexities and concavities are on the surface of the embedded insulating layer 13. There are no specific limitations to the configuration, locations, and number of the convexities and concavities. The size of the convexities and concavities located adjacent to each other may be different. In FIG. 1, the upper side is the surface to be polished. The same is applied to the other drawings.

In the polishing method of the present invention, the slurries (A) and slurry (B) are respectively used in the first and second polishing steps to polish the object 1.

Figure 2:
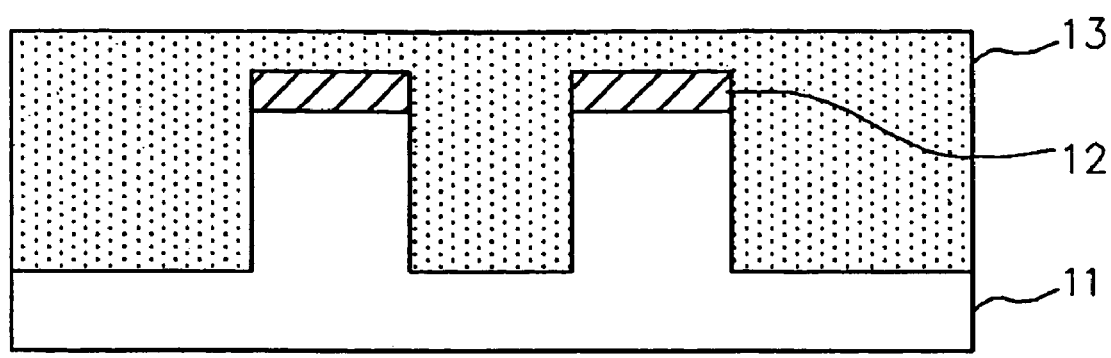
FIG. 2 is a cross-sectional view illustrating the object to be polished of which the embedded insulating layer that is an upper layer of the object has been polished in the first polishing step of the present invention.

When polishing the object 1, the embedded insulating layer 13 is first flattened in the first polishing step using the slurry (A) under the same conditions as the conditions in which the polishing speed for a film without a pattern made from the same material as used for the polished surface is preferably 500 Å/min or less, more preferably 100–450 Å/min, and still more preferably 200–400 Å/min (see FIG. 2). The polishing speed may be changed in the above range during the first polishing step. If the polishing speed is more than 500 Å/min, flatness of the polished surface tends to be insufficient.

In the first polishing step, the object is polished to the extent that the stopper layer 12 formed on the convexities on the substrate is not exposed. If the object is polished until the stopper layer 12 is exposed, flatness of the polished surface tends to be insufficient. Although there are no specific limitations to the thickness of the remaining embedded insulating layer 13 on the stopper layer 12 after polishing, such a thickness is preferably 100–1,000 Å, and more preferably 200–600 Å.

Figure 3:
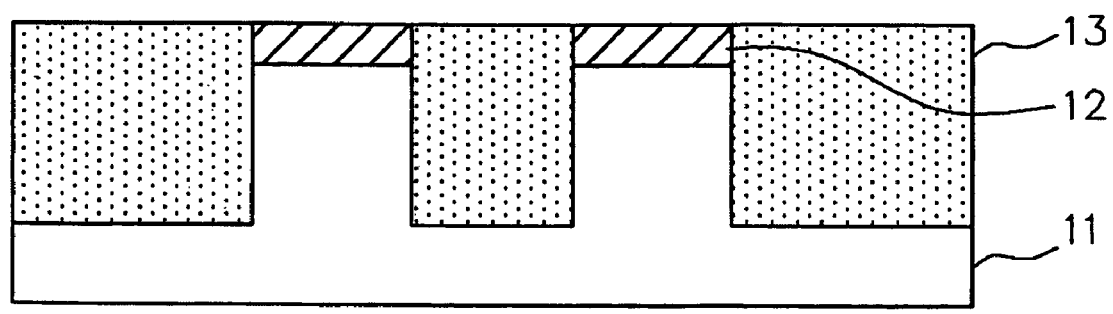
FIG. 3 is a cross-sectional view illustrating the object when the stopper layer has been exposed in the second polishing step of the present invention.

Next, in the second polishing step, the remaining embedded insulating layer 13 that has been flattened is polished while maintaining flatness until the stopper layer 12 formed on the convexities on the substrate is exposed using the slurry (B) under the same conditions as the conditions in which the polishing speed for a film without a pattern made from the same material as used for the polished surface is preferably 600 Å/min or more, more preferably 650–10,000 Å/min, and still more preferably 700–7,000 Å/min (see FIG. 3). A natural oxidation film may be formed on the outermost surface of the stopper layer 12 in the stage of producing the object 1. In such a case, the second polishing step is terminated when the natural oxidation film has been polished. The polishing speed may be changed in the above range during the second polishing step. If the polishing speed is less than 600 Å/min, a part of the embedded insulating layer 13 may remain on the outermost surface of the stopper layer 12.

Figure 4:
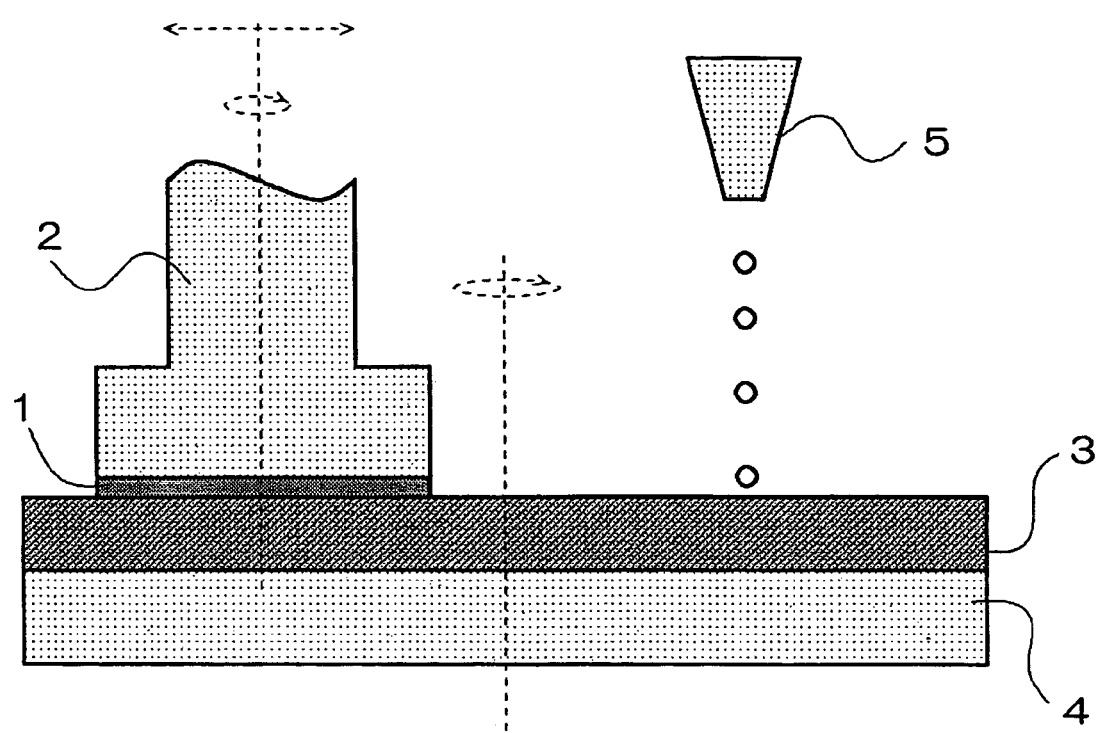
FIG. 4 is a view illustrating the manner of polishing.

Polishing apparatuses used in the chemical/mechanical polishing method for STI of the present invention include, for example, "EPO-112" and "EPO-222" manufactured by Ebara Corp., "LGP-510" and "LGP-552" manufactured by Lapmaster SFT Corp., "Mirra" manufactured by Applied Materials, Inc., "Teres" manufactured by Ram Research Co., and "AVANTI 472" manufactured by Speed Fam-IPEC Co., Ltd. These polishing apparatuses typically polish the object to be polished in the manner as shown in FIG. 4. Specifically, a polishing pad 3 is secured on an axially rotatable polishing table 4 and the object 1 is attached to one end of a pressing head 2. The pressing head 2 can cause the object 1 to slide on the polishing pad 3 by rotating and moving by itself while pressing the object 1 onto the surface of the polishing pad 3. The object 1 is polished by a slurry dropped onto the surface of the polishing pad 3 from above (e.g. slurry delivering section 5) while the object 1 is caused to slide.

Polishing pads known in the art such as "IC1000/SUBA400", "IC1010", "SUBA" series, and "Polytex" series (all manufactured by Rodel Nitta Co.) can be used. Pads made from either the same or different materials can be used in the first polishing step and the second polishing step of the present invention.

The first polishing step and the second polishing step may be carried out either on the same polishing table or different polishing tables installed on a polishing apparatus. When the first and second polishing steps are carried out on the same polishing table, the slurries (A) and (B) supplied from the slurry delivering section may be switched. On the other hand, when different polishing tables are used, the first and second polishing steps in which slurries with different compositions satisfying the requirement for different polishing speeds are used can be carried out on separate polishing tables. Polishing can thus be efficiently performed. The polishing operation using different polishing pads also brings about the same effect.

The operation using different polishing tables is not limited to an operation using different polishing tables in the first polishing step and the second polishing step. An operation using different polishing tables in the first polishing step may also be used. Both operations exhibit the same effect.

The above two polishing steps may be followed by a washing step.

EXAMPLES

The present invention is described below in more detail by examples. In the examples and comparative examples, "part(s)" means "part(s) by weight" and "%" means "wt %" unless otherwise indicated.

Example 1

A slurry (A) containing 0.5% of ceria particles with an average particle diameter of 0.14 μm, as abrasive grains, and 1.4% of ammonium polyacrylate (indicated as "PAA-NH$_4$" in the table) with a polyethylene glycol-reduced weight average molecular weight determined by aqueous GPC of 8,000 was prepared. This slurry was used as a slurry (A1) for the first polishing step (hereinafter referred to as "the first step"). On the other hand, a slurry (B) containing 6% of silica particles with an average particle diameter of 0.18 μm and 0.05% of the above ammonium polyacrylate was prepared. This slurry was used as a slurry (B1) for the second polishing step (hereinafter referred to as "the second step").

The polishing speeds achieved by the slurries (A1) and (B1) when polishing a uniform film (without convexities and concavities) made from PETEOS were determined using a polishing apparatus ("EPO 112" manufactured by Ebara Corp.) under the following polishing conditions 1. The results are shown in

TABLE 1

| (Polishing conditions 1) |
| --- |
| Polishing pad: IC1000 (P) manufactured by Rodel Inc. |
| Carrier load: 500 g/cm$^2$ |
| Carrier rotation: 107 rpm |
| Polishing table rotation: 100 rpm |
| Slurry feed amount: 200 ml/min |
| Polishing time: 1 minute |

Figure 5:
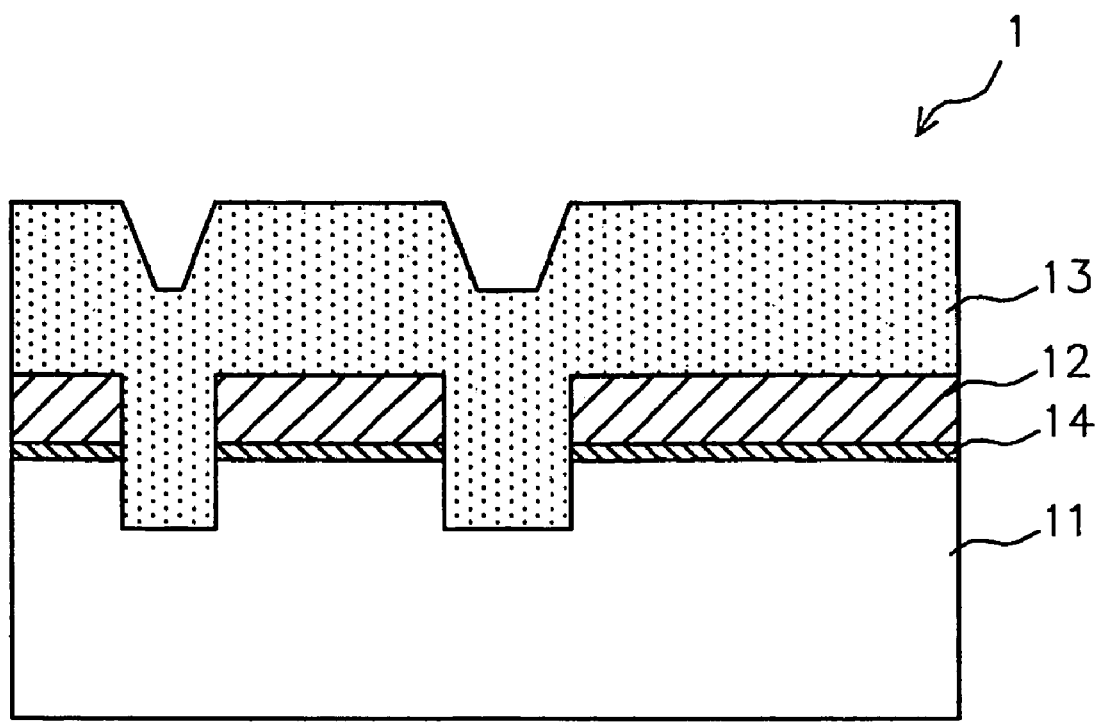
FIG. 5 is a cross-sectional view illustrating an object to be polished (wafer) used in the examples.
Figure 6:
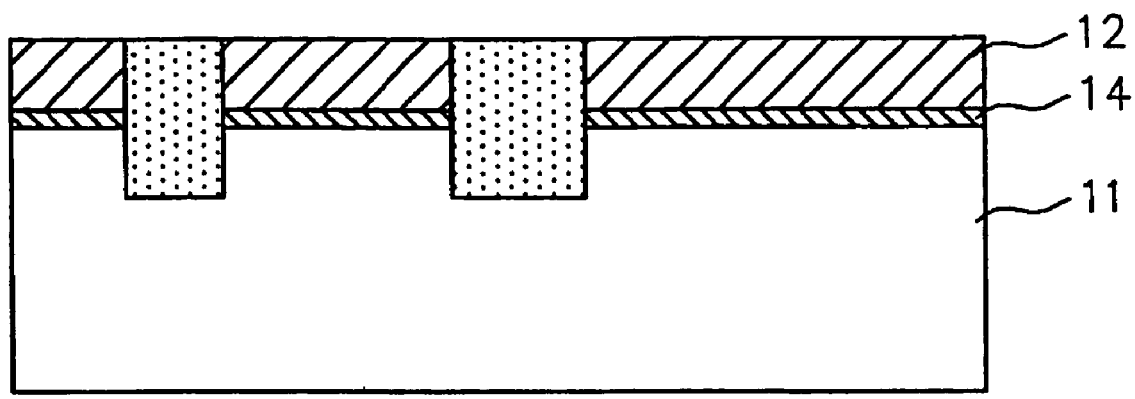
FIG. 6 is a cross-sectional view illustrating the object in the examples when the stopper layer has been exposed in the second polishing step.

A wafer ("SKW-3" manufactured by SKW Associates, Inc.; see FIG. 5) comprising a silicon substrate 11 with grooves, each having a width of 100 μm and a depth of about 0.5 μm, formed at a pitch of 200 μm, a silicon oxide film 14 with a thickness of 10–15 nm formed on the silicon substrate 11, a stopper layer (silicon nitride film) 12 with a thickness of 150–200 nm formed on the silicon oxide film 14, and an embedded insulating film 13 with a thickness of about 0.8 μm formed on the stopper layer 12 from PETEOS, the insulating film filling the grooves on the silicon substrate 11 (grooves are formed on the surface of the embedded insulating film 13 and make the surface irregular), was polished. Specifically, the first step using the slurry (A1) was carried out for a period of time described in Table 2 under the following polishing conditions 2 until the embedded insulating film 13 was polished to the extent that the surface was flattened with no convexities and concavities thereon. Next, the second step using the slurry (B1) was carried out for a period of time described in Table 2 on the same polishing table as used in the first step under the following conditions 2 until the embedded insulating film 13 was polished to the extent that the stopper layer 12 was exposed. Since the same polishing table was used in the first and second steps, the polishing table in Table 2 was indicated by T1.

(Polishing conditions 2)
Polishing pad: IC1010 manufactured by Rodel Inc.
Carrier load: 490 g/cm$^2$
Carrier rotation: 105 rpm
Polishing table rotation: 100 rpm
Slurry feed amount: 200 ml/min
Polishing time: 2 minutes After polishing, the thickness loss of the silicon nitride film was measured using a thickness measurement apparatus "UV1280" manufactured by KLA-Tencor Corp. The thickness loss was found to be 85 Å.

To observe flatness of the PETEOS section in the embedded insulating film embedded in the grooves of the silicon substrate, the grooved section of the polished wafer was fractured. The cross-section was inspected by an electron microscope and dishing (the depth of concavities from the horizontal surface of the silicon nitride film) was measured to find that the dishing was 630 Å.

Defects on the polished surface of the PETEOS section were inspected using a wafer defect inspection apparatus "KLA2351" manufactured by KLA-Tencor Corp. 100 or more defects randomly selected were observed to determine the ratio of scratches and the number of scratches was calculated based on such a ratio. As a result, 250 scratches were found.

The results are shown in Table 2.

Examples 2–4

The polishing speeds of slurries (A2)–(A4) and slurries (B2)–(B4), each containing the ammonium polyacrylate in an amount described in Table 2, were measured in the same manner as in Example 1. The results are shown in Table 1. The wafer was polished for a period of time described in Table 2 in the same manner as in Example 1 to evaluate the above-described performance of the slurries. The results are shown in Table 2.

Examples 5–8

Slurries (A5)–(A8) and slurries (B5)–(B8) were prepared in the same manner as in Example 1, except that the same abrasive grains (ceria particles) as used for the slurry (A) were added to the slurry (B) and the amounts of components were changed as shown in Table 3. The polishing speeds of these slurries were measured in the same manner as in Example 1. The results are shown in Table 1. The wafer was polished for a period of time shown in Table 3 in the same manner as in Example 1 to evaluate the above-described performance of the slurries. The results are shown in Table 3.

Examples 9–14

Slurries (A9)–(A14) and slurries (B9)–(B14) were prepared in the same manner as in Example 1, except that the kinds and amounts of the abrasive grains and additives added to the slurry (A) and slurry (B) were changed as described in Table 4 and Table 5 and a polishing apparatus ("Mirra" manufactured by Applied Materials, Inc.) having two or more polishing tables was used. The polishing speeds of these slurries were measured in the same manner as in Example 1. The results are shown in Table 1. The wafer was polished for a period of time described in Table 4 and Table 5 in the same manner as in Example 1 to evaluate the above-described performance of the slurries. The results are shown in Tables 4 and 5. In Example 9, different polishing tables were used for the first step and second step. In Examples 10–14, the first step was carried out in two stages using two different polishing tables, whereas the second step was carried out using still another polishing table. Since different polishing tables were used, the polishing tables in Table 3 were indicated by T1, T2, and T3. The same indication was applied to the following Examples. In the Tables, "DBS-NH$_4$" stands for ammonium dodecylbenzenesulfonate and "PAA-K" stands for potassium polyacrylate with an weight average molecular weight of 6,000 and a neutralization degree of 80%.

Comparative Example 1

The wafer was polished for a period of time described in Table 6 in the same manner as in Example 1 except for using only a slurry (A15) with a polishing speed of 1,800 Å/min when polishing a uniform film made from PETEOS. The results are shown in Table 6.

Comparative Examples 2–4

The polishing speeds of slurries (A16)–(A18) and slurries (B16)–(B18) were measured in the same manner as in Example 10, except that the kinds and amounts of the abrasive grains and additives added to the slurry (A) and slurry (B) were changed as shown in Table 6 and a polishing apparatus having a plurality of polishing tables was used. The wafer was polished in the same manner as in Example 1 for a period of time described in Table 6 to evaluate the above-described performance of the slurries. The results are shown in Table 6.

TABLE 1

|  | Polishing speed (Å/min) | | | |
|---|---|---|---|---|
|  | Slurry (A) | | Slurry (B) | |
| Example 1 | A1 | 485 | B1 | 820 |
| Example 2 | A2 | 325 | B2 | 820 |
| Example 3 | A3 | 225 | B3 | 820 |
| Example 4 | A4 | 185 | B4 | 820 |
| Example 5 | A5 | 300 | B5 | 880 |
| Example 6 | A6 | 300 | B6 | 1220 |
| Example 7 | A7 | 300 | B7 | 1520 |
| Example 8 | A8 | 300 | B8 | 1900 |
| Example 9 | A9 | 300 | B9 | 750 |
| Example 10 | A10 | 300 | B10 | 750 |
| Example 11 | A11 | 450 | B11 | 1520 |
| Example 12 | A12 | 320 | B12 | 1520 |
| Example 13 | A13 | 321 | B13 | 1850 |
| Example 14 | A14 | 340 | B14 | 630 |
| Comparative Example 1 | A15 | 1800 | B15 | — |
| Comparative Example 2 | A16 | 3250 | B16 | 485 |
| Comparative Example 3 | A17 | 510 | B17 | 630 |
| Comparative Example 4 | A18 | 480 | B18 | 550 |

TABLE 2

|  | Example 1 | | | Example 2 | | | Example 3 | | | Example 4 | | |
|---|---|---|---|---|---|---|---|---|---|---|---|---|
| First step | Slurry A1 | Ceria | 0.5 | Slurry A2 | Ceria | 0.5 | Slurry A3 | Ceria | 0.5 | Slurry A4 | Ceria | 0.5 |
|  |  | PAA-NH$_4$ | 1.4 |  | PAA-NH$_4$ | 1.6 |  | PAA-NH$_4$ | 1.8 |  | PAA-NH$_4$ | 2.0 |
|  | Polishing table | | T1 | Polishing table | | T1 | Polishing table | | T1 | Polishing table | | T1 |
|  | Polishing time (sec) | | 65 | Polishing time (sec) | | 80 | Polishing time (sec) | | 120 | Polishing time (sec) | | 180 |
| Second step | Slurry B1 | Silica | 6.0 | Slurry B2 | Silica | 6.0 | Slurry B3 | Silica | 6.0 | Slurry B4 | Silica | 6.0 |
|  |  | PAA-NH$_4$ | 0.05 |  | PAA-NH$_4$ | 0.05 |  | PAA-NH$_4$ | 0.05 |  | PAA-NH$_4$ | 0.05 |
|  | Polishing table | | T1 | Polishing table | | T1 | Polishing table | | T1 | Polishing table | | T1 |
|  | Polishing time (sec) | | 30 | Polishing time (sec) | | 30 | Polishing time (sec) | | 30 | Polishing time (sec) | | 30 |
| Evaluation | Si$_3$N$_4$ loss (Å) | | 85 | Si$_3$N$_4$ loss (Å) | | 60 | Si$_3$N$_4$ loss (Å) | | 70 | Si$_3$N$_4$ loss (Å) | | 120 |
|  | Dishing (Å) | | 630 | Dishing (Å) | | 510 | Dishing (Å) | | 390 | Dishing (Å) | | 230 |
|  | Number of scratches | | 250 | Number of scratches | | 280 | Number of scratches | | 190 | Number of scratches | | 280 |

TABLE 3

|  |  | Example 5 |  |  | Example 6 |  |  | Example 7 |  |  | Example 8 |  |
|---|---|---|---|---|---|---|---|---|---|---|---|---|
| First step | Slurry A5 | Ceria | 0.5 | Slurry A6 | Ceria | 0.5 | Slurry A7 | Ceria | 0.5 | Slurry A8 | Ceria | 0.5 |
|  |  | PAA-NH$_4$ | 1.5 |  | PAA-NH$_4$ | 1.5 |  | PAA-NH$_4$ | 1.5 |  | PAA-NH$_4$ | 1.5 |
|  | Polishing table |  | T1 | Polishing table |  | T1 | Polishing table |  | T1 | Polishing table |  | T1 |
|  | Polishing time (sec) |  | 120 | Polishing time (sec) |  | 120 | Polishing time (sec) |  | 120 | Polishing time (sec) |  | 120 |
| Second step | Slurry B5 | Ceria | 0.5 | Slurry B6 | Ceria | 0.5 | Slurry B7 | Ceria | 0.5 | Slurry B8 | Ceria | 0.5 |
|  |  | PAA-NH$_4$ | 1.2 |  | PAA-NH$_4$ | 1.1 |  | PAA-NH$_4$ | 1.0 |  | PAA-NH$_4$ | 0.9 |
|  | Polishing table |  | T1 | Polishing table |  | T1 | Polishing table |  | T1 | Polishing table |  | T1 |
|  | Polishing time (sec) |  | 35 | Polishing time (sec) |  | 25 | Polishing time (sec) |  | 20 | Polishing time (sec) |  | 16 |
| Evaluation | Si$_3$N$_4$ loss (Å) |  | 45 | Si$_3$N$_4$ loss (Å) |  | 60 | Si$_3$N$_4$ loss (Å) |  | 54 | Si$_3$N$_4$ loss (Å) |  | 75 |
|  | Dishing (Å) |  | 120 | Dishing (Å) |  | 160 | Dishing (Å) |  | 150 | Dishing (Å) |  | 250 |
|  | Number of scratches |  | 210 | Number of scratches |  | 220 | Number of scratches |  | 105 | Number of scratches |  | 110 |

TABLE 4

|  |  | Example 9 |  |  | Example 10 |  |  | Example 11 |  |
|---|---|---|---|---|---|---|---|---|---|
| First step | Slurry A9 | Ceria | 0.5 | Slurry A10 | Ceria | 0.5 | Slurry A11 | Ceria | 0.5 |
|  |  | PAA-NH$_4$ | 1.5 |  | PAA-NH$_4$ | 1.5 |  | DBS-NH$_4$ | 0.05 |
|  | Polishing table |  | T1 | Polishing table |  | T1 + T2 | Polishing table |  | T1 + T2 |
|  | Polishing time (sec) |  | 120 | Polishing time (sec) |  | 60 + 60 | Polishing time (sec) |  | 40 + 40 |
| Second step | Slurry B9 | Ceria | 0.5 | Slurry B10 | Ceria | 0.5 | Slurry B11 | Ceria | 0.5 |
|  |  | PAA-NH$_4$ | 1.2 |  | PAA-NH$_4$ | 1.2 |  | DBS-NH$_4$ | 0.02 |
|  | Polishing table |  | T2 | Polishing table |  | T3 | Polishing table |  | T3 |
|  | Polishing time (sec) |  | 30 | Polishing time (sec) |  | 30 | Polishing time (sec) |  | 20 |
| Evaluation | Si$_3$N$_4$ loss (Å) |  | 250 | Si$_3$N$_4$ loss (Å) |  | 210 | Si$_3$N$_4$ loss (Å) |  | 95 |
|  | Dishing (Å) |  | 165 | Dishing (Å) |  | 185 | Dishing (Å) |  | 89 |
|  | Number of scratches |  | 110 | Number of scratches |  | 190 | Number of scratches |  | 390 |

TABLE 5

|  |  | Example 12 |  |  | Example 13 |  |  | Example 14 |  |
|---|---|---|---|---|---|---|---|---|---|
| First step | Slurry A12 | Ceria | 0.5 | Slurry A13 | Ceria | 0.5 | Slurry A14 | Silica | 6.0 |
|  |  | DBS-NH$_4$ | 0.1 |  | PAA-K | 1.2 |  | DBS-NH$_4$ | 0.05 |
|  | Polishing table |  | T1 + T2 | Polishing table |  | T1 + T2 | Polishing table |  | T1 + T2 |
|  | Polishing time (sec) |  | 50 + 50 | Polishing time (sec) |  | 60 + 60 | Polishing time (sec) |  | 60 + 60 |
| Second step | Slurry B12 | Ceria | 0.5 | Slurry B13 | Ceria | 0.5 | Slurry B14 | Silica | 6.0 |
|  |  | DBS-NH$_4$ | 0.02 |  | PAA-K | 0.02 |  | DBS-NH$_4$ | 0.01 |
|  | Polishing table |  | T3 | Polishing table |  | T3 | Polishing table |  | T3 |
|  | Polishing time (sec) |  | 20 | Polishing time (sec) |  | 20 | Polishing time (sec) |  | 20 |
| Evaluation | Si$_3$N$_4$ loss (Å) |  | 90 | Si$_3$N$_4$ loss (Å) |  | 160 | Si$_3$N$_4$ loss (Å) |  | 210 |
|  | Dishing (Å) |  | 83 | Dishing (Å) |  | 350 | Dishing (Å) |  | 620 |
|  | Number of scratches |  | 420 | Number of scratches |  | 210 | Number of scratches |  | 320 |

TABLE 6

|  |  | Comparative Example 1 |  |  | Comparative Example 2 |  |  | Comparative Example 3 |  |  | Comparative Example 4 |  |
|---|---|---|---|---|---|---|---|---|---|---|---|---|
| First step | Slurry A15 | Ceria | 0.5 | Slurry A16 | Ceria | 0.5 | Slurry A17 | Silica | 6.0 | Slurry A18 | Ceria | 0.5 |
|  |  | PAA-NH$_4$ | 1.0 |  | PAA-NH$_4$ | 0.6 |  | DBS-NH$_4$ | 0.03 |  | PAA-NH$_4$ | 1.4 |
|  | Polishing table |  | T1 | Polishing table |  | T1 + T2 | Polishing table |  | T1 + T2 | Polishing table |  | T1 + T2 |
|  | Polishing time (sec) |  | 60 | Polishing time (sec) |  | 60 + 60 | Polishing time (sec) |  | 60 + 60 | Polishing time (sec) |  | 60 + 60 |
| Second step | Slurry B15 | — | — | Slurry B16 | Ceria | 0.5 | Slurry B17 | Silica | 6.0 | Slurry B18 | Ceria | 0.6 |
|  |  | — | — |  | PAA-NH$_4$ | 1.4 |  | DBS-NH$_4$ | 0.01 |  | PAA-NH$_4$ | 1.35 |
|  | Polishing table |  | — | Polishing table |  | T3 | Polishing table |  | T3 | Polishing table |  | T3 |
|  | Polishing time (sec) |  | — | Polishing time (sec) |  | 20 | Polishing time (sec) |  | 20 | Polishing time (sec) |  | 60 |
| Evaluation | Si$_3$N$_4$ loss (Å) |  | 720 | Si$_3$N$_4$ loss (Å) |  | 300 | Si$_3$N$_4$ loss (Å) |  | 320 | Si$_3$N$_4$ loss (Å) |  | −210 |
|  | Dishing (Å) |  | 3400 | Dishing (Å) |  | 1200 | Dishing (Å) |  | 2860 | Dishing (Å) |  | 420 |
|  | Number of scratches |  | 350 | Number of scratches |  | 2150 | Number of scratches |  | 1520 | Number of scratches |  | 420 |

Comparative Example 1 in Table 6 is an embodiment employing only the first step. It can be seen that the thickness loss of the silicon nitride film was large (720 Å) and dishing was large (3,400 Å). Comparative Example 2 is an embodiment using the slurry (B16) with a polishing speed of less than 600 Å/min in the second step. Dishing was large (1,200 Å), resulting in products with poor flatness. In addition, there were a very large number of scratches (2,150 scratches). Comparative Example 3 is an embodiment using the slurry (A17) with a polishing speed of more than 500 Å/min in the first step. The thickness loss of the silicon nitride film and dishing were worse than in Comparative Example 2, resulting in products with poor flatness. In addition, there were a large number of scratches (1,520 scratches). Comparative Example 4 is an embodiment using the slurry (B18) with a polishing speed of less than 600 Å/min in the second step. A PETEOS part was left on the silicon nitride film, as indicated by $Si_3N_4$ loss of −210 Å in Table 6.

On the other hand, the products polished in Examples 1–14 exhibited excellent flatness with dishing of 1,000 Å or less and the thickness loss of the silicon nitride film was small. The number of scratches was not more than 500 (105–110 in Examples 7–9), which was a level with no problem.

According to the chemical/mechanical polishing method for STI of the present invention, shallow trench isolation regions can be efficiently flattened at a sufficiently high polishing speed in polishing an object with convexities and concavities on the surface. Moreover, dishing in the embedded insulating part in which an insulating material is embedded in concavities on a substrate is very small, and the number of scratches on the polished surface is also very small. Therefore, a very useful chemical/mechanical polishing method in the STI technology and the like can be provided.

When the slurry (A) and slurry (B) contain abrasive grains containing ceria or silica, or both, the amounts of ceria and silica and the types and amounts of additives can be appropriately selected to produce slurries with a desired polishing speed. A polished surface with excellent flatness can be obtained by using such slurries.

When the slurry (A) and slurry (B) contain the same or different organic acid salts, slurries with a desired polishing speed can be easily obtained and a polished surface with excellent flatness can be obtained.

When the slurry (A) and slurry (B) contain the same organic acid salt, slurries with a desired polishing speed can be easily obtained and a polished surface with excellent flatness can be obtained if the content of the organic acid salt in the slurry (A) is larger than the content of the salt in the slurry (B).

When the organic acid salt is at least one type selected from the potassium salt of polyacrylic acid, ammonium salt of polyacrylic acid, potassium salt of dodecylbenzenesulfonic acid, and ammonium salt of dodecylbenzenesulfonic acid, slurries with a desired polishing speed can be easily obtained and a polished surface with excellent flatness can be obtained.

When the organic acid salt contained in both the slurry (A) and the slurry (B) is the potassium salt of polyacrylic acid, the content of the organic acid salt in the slurry (A) is 1.0 wt % or more, and the content of the organic acid salt in the slurry (B) is less than 1.0 wt %, slurries with a desired polishing speed can be easily obtained and a polished surface with excellent flatness can be obtained.

When the organic acid salt contained in both the slurry (A) and the slurry (B) is the ammonium salt of polyacrylic acid, the content of the organic acid salt in the slurry (A) is 1.3 wt % or more, and the content of the organic acid salt in the slurry (B) is less than 1.3 wt %, slurries with a desired polishing speed can be easily obtained and a polished surface with excellent flatness can be obtained.

When the organic acid salt contained in both the slurry (A) and the slurry (B) is the ammonium salt of dodecylbenzenesulfonic acid, the content of the organic acid salt in the slurry (A) is 0.03 wt % or more, and the content of the organic acid salt in the slurry (B) is less than 0.03 wt %, slurries with a desired polishing speed can be easily obtained and a polished surface with excellent flatness can be obtained.

When an object is polished on a polishing table provided on a polishing apparatus and the first and second polishing steps are respectively carried out on the same or different polishing tables, the chemical/mechanical polishing method exhibits excellent workability.

What is claimed is:

1. In a method for polishing an object to be polished with an irregular surface, having a substrate with convexities and concavities, a stopper layer formed on the convexities of the substrate, and an embedded insulating layer formed to cover the concavities of the substrate and the stopper layer, a chemical/mechanical polishing method for STI comprising:
    a first polishing step of flattening the embedded insulating layer using a slurry (A) which maintains the polishing speed at 500 Å/min or less and
    a second polishing step of further polishing the embedded insulating layer to cause the stopper layer on the convexities to be exposed using a slurry (B) which maintains the polishing speed at 600 Å/min or more, wherein
    the slurry (A) and the slurry (B) both contain the same organic acid salt; and
    a content of the organic acid salt in the slurry (A) is larger than a content of the organic acid salt in the slurry (B).

2. The chemical/mechanical polishing method for STI according to claim 1, wherein the slurry (A) and slurry (B) contain abrasive grains comprising at least one type selected from ceria and silica.

3. The chemical/mechanical polishing method for STI according to claim 1, wherein
    the content of the organic acid salt in the slurry (A) is 1.0 wt % or more;
    the content of the organic acid salt in the slurry (B) is less than 1.0 wt %; and
    the organic acid salt contained in both the slurry (A) and the slurry (B) is the potassium salt of polyacrylic acid.

4. The chemical/mechanical polishing method for STI according to claim 1, wherein
    the content of the organic acid salt in the slurry (A) is 1.3 wt % or more;
    the content of the organic acid salt in the slurry (B) is less than 1.3 wt %; and
    the organic acid salt contained in both the slurry (A) and the slurry (B) is the ammonium salt of polyacrylic acid.

5. The chemical/mechanical polishing method for STI according to claim 1, wherein
    the content of the organic acid salt in the slurry (A) is 0.03 wt % or more;
    the content of the organic acid salt in the slurry (B) is less than 0.03 wt %; and
    the organic acid salt contained in both the slurry (A) and the slurry (B) is the ammonium salt of dodecylbenzenesulfonic acid.

6. The chemical/mechanical polishing method for STI according to claim 1, wherein an object is polished on a polishing table provided on a polishing apparatus and the first and second polishing steps are respectively carried out on the same or different polishing tables.

7. In a method for polishing an object to be polished with an irregular surface, having a substrate with convexities and concavities, a stopper layer formed on the convexities of the substrate, and an embedded insulating layer formed to cover the concavities of the substrate and the stopper layer, a chemical/mechanical polishing method for STI comprising:
    a first polishing step of flattening the embedded insulating layer using a slurry (A) which maintains the polishing speed at 500 Å/min or less and
    a second polishing step of further polishing the embedded insulating layer to cause the stopper layer on the convexities to be exposed using a slurry (B) which maintains the polishing speed at 600 Å/min or more, wherein the slurry (A) and the slurry (B) both contain the same organic acid salt;

the organic acid salt is at least one type selected from the potassium salt of polyacrylic acid, ammonium salt of polyacrylic acid, potassium salt of dodecylbenzenesulfonic acid, and ammonium salt of dodecylbenzenesulfonic acid; and a content of the organic acid salt in the slurry (A) is larger than a content of the organic acid salt in the slurry (B).

8. The chemical/mechanical polishing method for STI according to claim 7, wherein the organic acid salt is at least one type selected from the potassium salt of dodecylbenzenesulfonic acid and the ammonium salt of dodecylbenzenesulfonic acid.

* * * * *